United States Patent [19]

Wehrle et al.

[11] Patent Number: 5,308,800
[45] Date of Patent: May 3, 1994

[54] APPARATUS AND METHOD FOR FORMING TEXTURED BULK HIGH TEMPERATURE SUPERCONDUCTING MATERIALS

[75] Inventors: John P. Wehrle, Riverdale; Barbara F. Howell; James G. Morris, III, both of Arnold, all of Md.

[73] Assignee: The United States of America as represented by the Secretary of the Navy, Washington, D.C.

[21] Appl. No.: 858,363

[22] Filed: Mar. 23, 1992

[51] Int. Cl.$^5$ ............................................. C30B 11/02
[52] U.S. Cl. .................. 505/400; 505/950; 505/450; 117/220
[58] Field of Search ............ 156/616.1, 616.4, 616.41; 505/1, 729; 422/245, 248

[56] References Cited

U.S. PATENT DOCUMENTS

| | | | |
|---|---|---|---|
| 2,206,440 | 7/1940 | Walker | 261/112 |
| 4,810,339 | 3/1989 | Heavens et al. | 204/180.1 |
| 4,880,772 | 11/1989 | Pederson et al. | 505/1 |
| 4,900,536 | 2/1990 | Snyder et al. | 423/593 |
| 4,904,638 | 2/1990 | DiCarolis | 505/1 |
| 4,906,608 | 3/1990 | Akinc et al. | 505/1 |
| 4,916,114 | 4/1990 | Hoeing | 505/1 |
| 4,931,426 | 6/1990 | Mihalich | 505/1 |
| 4,968,662 | 11/1990 | Urano et al. | 505/1 |
| 4,981,840 | 1/1991 | Brown et al. | 505/1 |
| 4,996,186 | 2/1991 | Wang et al. | 505/729 |
| 5,057,492 | 10/1991 | Oka et al. | 505/729 |
| 5,079,225 | 1/1992 | Holloway | 505/729 |
| 5,135,047 | 8/1992 | Dobren | 156/616.4 |
| 5,168,096 | 12/1992 | Tournier | 156/616.41 |

FOREIGN PATENT DOCUMENTS 1-157499  6/1989  Japan ......................... 505/729

OTHER PUBLICATIONS

McGuire, ". . . Crystals", Applied Physics Letters 51(13) Sep. 28, 1987 pp. 1040-1042.
Schneemeyer et al. "Superconductivity in $YBa_2Cu_3O_7$ Single Crystals" Nature vol. 328 Aug. 13, 1987 601-603.

*Primary Examiner*—Robert Kunemund
*Attorney, Agent, or Firm*—Howard Kaiser

[57] ABSTRACT

Apparatus and method for fabricating textured pseudo-single crystal bulk superconducting materials, featuring introduction of a pressure gradient and/or of a magnetic field for enhancement of known melt-texturing directional solidification techniques using a steep temperature gradient furnace for increasing temperatures at which superconductive properties can be maintained in superconducting materials. The strengths of the temperature gradient, pressure gradient and/or magnetic field can be optimally varied, resulting in formation of superconducting material exhibiting superconductive properties at higher temperatures than previously achievable.

10 Claims, 1 Drawing Sheet

APPARATUS AND METHOD FOR FORMING TEXTURED BULK HIGH TEMPERATURE SUPERCONDUCTING MATERIALS

The invention described herein may be manufactured and used by or for the Government of the United States of America for governmental purposes without the payment of any royalties thereon or therefor.

BACKGROUND OF THE INVENTION

The present invention relates to fabrication methods for high temperature superconducting materials, more particularly to melt-texturing fabrication methods for bulk high temperature superconducting materials.

According to conventional methods of preparing ceramic superconductors, suitable powders of oxides are prepared; these powders must be spatially and chemically homogeneous. See Mitchell, T. E., D. R. Clarke, J. D. Embury, and A. R. Cooper, "Processing Ceramic Superconductors," JOM 41 (1) 6–10 (1989), incorporated herein by reference. Such methods of powder production have included vapor or sol-gel routes of coprecipitation or mechanical blending.

In the case of $YBa_2Cu_3O_7$ the latter procedure has been more frequently employed. Typically $BaCO_3$, $Y_2O_3$, and $CuO$ are mixed together and calcined at 800° C. for six hours in air. Calcining is followed by ball milling with zirconia in dry acetone for one hour, die pressing the mixed powder, then sintering at 950° C. These procedures are followed by oxygenation at 450° C., remilling, and repeating the sintering-oxygenating step. Production of sub-micron size powder is highly desirable. The powder is once again die compressed up to 70% dense material. Pressure sintering has also been tried. This procedure involves sinter-forging, hot isostatic pressing and hot extension. Control of oxygen content is believed to be very important in elevating $T_c$.

Melt-quenching is another method by which superconducting ceramics can be prepared. This involves melt-quenching rather than slow cooling after annealing. See Komatsu, T., T. Ohki, K. Imai, and K. Matusita, "Preparation of Superconducting Ba-Gd-Cu-O and Ba-Yb-Cu-O Ceramics by the Melt Quenching method," J. Mater. Sci. Lett. 8 (1) 1–3 (1989), incorporated herein by reference. Here the nominal stoichiometric composition of oxides, e.g., $Ba_2YCu_3O_{7-x}$, is first quenched and then annealed at approximately 900° C. Ba-Gd-Cu-O samples annealed 72 hours superconduct to 94° K. with current densities of 50 A-cm$^{-2}$. Ba-Yb-Cu-O samples annealed 48 hours superconduct to 90° K.

Elevation of $T_c$ has also been accomplished by thermal cycling of $YBa_2Cu_3O_{7-y}$ below 240° K. See Bhargava, R. N., S. P. Herko, and W. N. Osborne, "Improved High-$T_c$ Superconductors," Phys. Rev. Lett. 59 1468 (1987), incorporated herein by reference. It is believed that compositional inhomogeneities are responsible for $T_c$ lowering. Therefore, a semi-wet method has been tested as a way to reduce these inhomogeneities more effectively than does repeated grinding and firing. See Pandey, D., V. S. Tiwari, and A. K. Singh, "A Semi-wet Route to the Synthesis of $YBa_2Cu_3O_{7-y}$ Ceramics," J. Phys. D: Appl. Phys. 22 182–186 (1989), incorporated herein by reference. For the semi-wet method, yttrium and barium chloride salts are mixed in the correct stoichiometric ratio and then are coprecipitated with ammonium carbonate solution. X-ray diffraction of the solid mixture shows that the compositional inhomogeneities are greatly reduced with this technique.

Other methods have been investigated for improving superconductivity properties. These include those methods disclosed by the following references, all of which are incorporated herein by reference: Murugaraj, P., J. Maier, and A. Rabenau, "Preparation and Characterization of Highly Oriented Ceramics and Large Crystals of $YBa_2Cu_3O_x$ Superconductor," Duro-Ceramics 2 421–5 (1989) (production of highly ordered materials with large crystals); Van der Biest, O. O., J. Fransaer, T. Eggermont, and O. Arkens, "A Versatile Sol-Gel Method for Synthesis of Ceramic Superconductors," Euro-Ceramics 2 405–9 (1989) (sol-gel preparation utilizing EDTA); Merzhanov, A. G., "Self-Propagating High-Temperature Synthesis of Ceramic (Oxide) Superconductors," Ceram. Trans., 519–49 (1990) (self-propagating high-temperature synthesis with the use of Cu as a fuel and Y and Ba as oxidizers); Pak, S. S., and K. S. Mazdiyasni, "Synthesis and Characterization of Sol-Gel Derived, Submicron Size, High $T_c$ Ceramic Superconductor Powders," Ceram. Trans., 757–64 (1990) (use of powders of high chemical and phase purity synthesized by homogeneous hydrolytic decomposition of the component oxides); Mihalich, "Process for Preparing Crystalline Ceramic Superconductor Materials by Fluidized-Bed Calcination," U.S. Pat. No. 4,931,426 (1990) (use of a fluidized-bed calcination process); Kayima, P. M., and S. Qutubuddin, "Preparation of Monosized, Spherical, Colloidal Particles of Yttrium Barium Cuprate Superconducting Oxide Ceramic Precursors," J. Mater. Sci. Lett. 8 (2) 171–2 (1989) (homogeneous solution precipitation of metal ions by in situ decomposition of urea at elevated temperatures); Kodas, T. T., E. M. Engler, V. Y. Lee, R. Jacowitz, T. H. Baum, K. Roche, S. S. P. Parkin, W. S. Young, S. Hughes, J. Kleder, and W. Auser, "Aerosol Flow Reactor Production of Fine $Y_1Ba_2Cu_3O_7$ Powder: Fabrication of Superconducting Ceramics," Appl. Phys. Lett. 52 (19) 1622–4 (1988) (use of an aerosol flow reactor operating at 900°–1,000° C. which gives a uniform chemical composition and a submicron-to-micron average particle size formed from the thermal decomposition of aerosol droplets containing nitrate salts of the required metals); Falter, L. M., D. A. Payne, T. A. Friedmann, W. H. Wright, and D. M. Ginsberg, "Preparation of Ceramic Superconductors by the Pechini Method," Br. Ceram. Proc. 261–9 (1989) (employment of a liquid-solution resin-forming process from which powders are formed into dense ceramics by hot-pressing); Jin, S., T. H. Tiefel, R. C. Sherwood, R. B. van Dover, M. E. Davis, G. W. Kammlott, and R. A. Fastnacht, "Melt-textured Growth of Polycrystalline $YBa_2Cu_3O_{7-x}$ with High Transport $J_c$ at 77 K.," Physical Review B 37 7850–7853 (1988) (melt-texturing); and Richardson, T. J., and L. C. De Jonghe, "Traveling Reaction Zone Method for Preparation of Textured Ceramic Superconductor Thick Films," J. Am. Ceram. Soc. 73 (11) 3511–13 (1990), and Richardson, T. J., and L. C. De Jonghe, "Travelling Solvent Zone Texturing of Ceramic Superconductor Thick Films," J. Mater. Sci. Lett. 84 (10) 369–370 (1991) (melt-texturing using a steep temperature gradient furnace).

Other references of note, incorporated herein by reference, are: Zhang, J. M., B. W. Wessels, D. S. Richeson, and T. J. Marks, "Preparation and Properties of Superconducting Bi-Sr-Ca-Cu-O Thin Films on Polycrystalline Silver Substrates by Organometallic Chemical Vapor Deposition," Journal of Crystal Growth 107 705-709 (1991); Nakagawa, S, T. Takeuchi and M. Name, "Preparation of YBaCuO Thin Films with Excellent Crystallinity on Amorphous Substrates Prepared by Facing Targets Sputtering," IEEE Transactions on Magnetics 26 (5) 1430-1432 (September 1990); Brown et al., "Process for Preparing Metal-Ceramic Coatings Electrically Superconducting above 77 Degrees Kappa," U.S. Pat. No. 4,981,840; Urano et al., "Method of the Production of Ceramic Superconductor Filaments," U.S. Pat. No. 4,968,662; Hoenig, "Method for Producing a Layer-Like Composition of Oxide-Ceramic Superconducting Material," U.S. Pat. No. 4,916,114; Akinc et al., "Method for Preparing Superconductors Ceramic Composition," U.S. Pat. No. 4,906,608; DiCarolis, "Method of Producing Superconducting Ceramics by Co-Preciptation of Carbonates," U.S. Pat. No. 4,904,638; Snyder et al., "Preparation of Precursors for Yttrium-Containing Ceramic Superconductors," U.S. Pat. No. 4,900,536; Pederson et al., "Preparation of Thin Ceramic Films Via an Aqueous Solution Route," U.S. Pat. No. 4,880,772; Heavens et al., "Preparing Superconducting Ceramic Materials," U.S. Pat. No. 4,810,339; Walker, "Apparatus for Exposing Liquids to Direct Contact with Air or Gases," U.S. Pat. No. 2,206,440.

Jin et al. report that melt-textured growth of $YBa_2Cu_3O_{7-x}$ from a supercooled melt created an essentially 100% dense structure of long, locally aligned, needle-shaped grains. Jin et al. describe a method wherein precursor samples of material with formula $YBa_2Cu_3O_{7-x}$ were prepared in rectangular bar or sheet shape, lead wires were attached to the samples by In solder, current was applied, the samples were melt-processed by heating either to the single-phase region or two-phase region, the samples were held at the selected temperatures (1320° C., 1180° C., 1110° C., 1030° C.) for 0.5-120 minutes in flowing oxygen environment, the samples were cooled in a temperature gradient of about 50° C./cm to room temperature, and the samples were subsequently given additional heat treatment for purposes of homogenization/stress relief/enhanced oxygen content. The process of cooling the samples in a temperature gradient is termed "melt-textured growth" in accordance with the manner in which the crystals are made to grow and align during solidification of the melt.

Mitchell et al., citing Jin et al., note that texture development in superconducting materials involves the concept of flux flow wherein a transport current provides a driving force acting on the flux lines. "Weak links" in terms of various chemical or structural inhomogeneities—e.g., grain boundaries, dislocations, particles—exert pinning forces which act to prevent flux flow. Utilization of single crystals avoids the weak link problem. Practical approaches to fabricating textured materials in the form of "pseudo-single" crystals, besides melt-texturing, have included deformation-texturing, magnetic-field alignment and epitaxial growth of films on substrates.

Jin et al. note that the exact mechanism responsible for the suppression of weak link behavior cannot be exactly pinpointed, but melt-texturing yields at least three beneficial structural changes: (1) formation of dense structure with enhanced connectivity between superconducting grains; (2) orientation of crystals along the preferred superconducting direction; and, (3) formation of new, cleaner grain-boundary area as grain length increases and total grain-boundary area decreases and as decomposition of impurities is facilitated by exposure to higher temperatures.

Of particular interest herein is the process disclosed by Richardson et al., a "melt-texturing" directional solidification process which increases the temperature at which superconductive properties can be maintained in metallic materials. According to Richardson et al., rare earth metal oxides are placed into a liquid solvent. The solution is then placed into an unevenly heated oven in which a strong temperature gradient can be formed. The oven is then rapidly heated to approximately 800° C. The oven temperature is then slowly dropped. In this process, as the solvent evaporates, it begins to flow in the direction of lower oven temperatures. As this reaction occurs, a metallic crystal is left behind having a highly aligned crystaline structure which results in the material exhibiting superconductive properties at a temperature of approximately 30° K. higher than is achieved when a similar previously used process is used wherein the solvent is evaporated in an oven not having a temperature gradient. It is currently not entirely understood exactly why such a process involving a temperature gradient results in a higher temperature superconductor.

Richardson et al. in the *Journal of the American Ceramic Society* disclose a method for producing a textured film of superconducting $YBa_2Cu_3O_{7-x}$, comprising the steps of: mixing $Y_2Cu_2O_5$ and $BaCuO_2$ so as to produce a mixture Of $Y_2Cu_2O_5$ and $BaCuO_2$ in a 1:4 mole ratio; ball-milling the mixture in acetone or isopropyl alcohol until producing a precursor powder with an average particle size of about 0.5 $\mu$m; mixing the precursor powder with isamyl alcohol so as to form a paste; applying the paste by the doctor blade method to a 1-mm-thick alumina plate so as to form a supported film 25 to 250 $\mu$m thick; drying the supported film at about 100° C.; and passing the supported film through a resistively heated steep temperature gradient furnace. In the *Journal of Materials Science Letters* Richardson et al. disclose such a method which comprises the following steps: ball-milling single-phase YBCO in an equal volume of potassium chloride so as to produce a precursor powder with an average particle size of about 1.0 $\mu$m; mixing said precursor powder with iso-amyl alcohol so as to form a paste; applying said paste by the doctor blade method to a 30 mm $\times$ 3 mm $\times$ 1 mm thick sintered MgO plate so as to form a supported film 200 $\mu$m thick; drying said supported film at about 100° C.; and passing said supported film lengthwise through a resistively heated steep temperature gradient furnace.

Richardson et al. in the *Journal of Materials Science Letters* note that bulk conductors capable of carrying currents in excess of $10^5$ $Acm^{-2}$ at 77 K. are desirable for large-scale practical applications of high-temperature ceramic superconductors. Highly textured material is required for the efficient transport of intergranular currents, due to the strongly anisotropic nature of the superconducting characteristics of $YBa_2Cu_3O_{7-x}$ (YBCO). Although well-oriented thin films have been prepared which exhibit critical current-field behavior akin to that of a good single crystal, their uses are limited to electronic device applications, due to the required vacuum equipment and low depositon rates. The logical approach is therefore to develop texture in thick films after they have been applied to the substrate. Previous approaches to melt-texturing produced highly aligned but inhomogeneous regions, because unwanted non-superconducting phases precipitate at the high temperatures required to melt YBCO; hence, the accumulation of secondary phases in the melt limited the length of samples textured by conventional zone melting.

Richardson et al. disclose an improved melt-texturing technique, viz., a "modified travelling solvent zone" (TSZ) technique, which produces highly oriented thick films of YBCO on a ceramic substrate. An appropriate solvent is used for reducing the melting point of the superconductor-solvent mixture to the regime of thermal stability for YBCO. The crystalline superconductor solute precipitates with grain alignment controlled by the preferred growth direction and the solvent concentration gradient. The precast YBCO-solvent mixture is passed through a steep temperature gradient furnace, dissolution and precipitation thereby taking place in a travelling solvent zone; a continuous, homogeneous, YBCO superconductor film is produced.

Recent superconducting material fabrication techniques implementing a melt-texturing process similar to that disclosed by Richardson et al. have utilized temperature gradients in the crystal growth phase at 800° C. temperature ranges or higher in order to facilitate proper crystal growth. These techniques have produced 125° K. rare earth metal oxide superconductors which are stable at approximately 30° K. higher temperatures than conventional 1-2-3 compounds. These newer rare earth materials are of greater utility than the conventional materials because of expected increased stability at liquid nitrogen temperatures.

What is not believed herein to have been previously disclosed in the art is a further improved approach to fabricating textured pseudo-single crystal superconductive materials, one which combines an additional texturing technique or additional texturing techniques with, and thereby enhances the superconductor-producing qualities of, Richardson et al.'s TSZ melt-texturing technique using a steep temperature gradient furnace.

OBJECTS OF THE INVENTION

In view of the foregoing, it is a principal object of the present invention to improve the upper temperature limit and other superconductivity properties of bulk superconducting materials which are produced by melt-texturing techniques using a steep temperature gradient furnace.

Other objects of this invention will become apparent from the following detailed description of the invention when considered in conjunct-Ion with the accompanying drawings.

SUMMARY OF THE INVENTION

The present invention provides improvements for methodology which uses temperature gradients in the preparation of bulk high temperature ceramic superconductor materials.

This invention provides apparatus for producing textured superconducting material, comprising a furnace, means for introducing a temperature gradient in the furnace, and means for introducing a pressure gradient in the furnace. For some embodiments this invention provides apparatus for producing textured superconducting material which further comprises means for introducing a magnetic field in said furnace. For other embodiments the present invention provides apparatus for producing textured superconducting material which comprises a furnace, means for introducing a temperature gradient in the furnace, and means for introducing a magnetic field in the furnace.

The present invention also provides a method for producing textured superconducting material, comprising forming a superconductor-solvent mixture, placing the mixture in a furnace, introducing a temperature gradient in the furnace, and introducing a pressure gradient in the furnace. For some embodiments the present invention provides a method for producing textured superconducting material which further comprises introducing a magnetic field in the furnace. For other embodiments this invention provides a method for producing textured superconducting material which comprises forming a superconductor-solvent mixture, placing the mixture in a furnace, introducing a temperature gradient in the furnace, and introducing a magnetic field in the furnace.

In accordance with many embodiments of this invention the pressure gradient is established in a furnace which also has a temperature gradient established while the solvent is being evaporated during the superconductor crystal formulation process. Introduction of the pressure gradient, along with introduction of the temperature gradient, causes even greater alignment of the crystalline structure of the crystal which is left behind after the solvent has evaporated than that which is achievable by means of introduction of the pressure gradient alone; hence, the superconductor material exhibits superconductive properties at even higher temperatures than previously achievable.

Many embodiments of this invention include, along with establishment of the temperature gradient, establishment of a magnetic field in the furnace; for some embodiments establishment of a magnetic field is in addition to establishment of a pressure gradient and for other embodiments establishment of a magnetic field is in lieu thereof. Introduction of the magnetic field induces chirality, which also acts to raise superconductive temperatures.

Accordingly, the present invention provides apparatus and process for forming superconductive crystals which advantageously result in increases in the temperature at which superconductive properties can be maintained in superconductive materials. In accordance with the present invention, and depending upon the embodiment thereof, by varying (i) the temperature gradient strength and the pressure gradient strength, or (ii) the temperature gradient strength and the magnetic field strength, or (iii) the temperature gradient strength and the pressure gradient strength and the magnetic field strength, an optimum combination of variables for achieving the highest temperature superconducting material is readily identifiable.

Other objects, advantages and features of this invention will become apparent from the following detailed description of the invention when considered in conjunction with the accompanying drawing.

BRIEF DESCRIPTION OF THE DRAWING

In order that the present invention may be clearly understood, it will now be described, by way of example, with reference to the accompanying drawing, wherein like numbers indicate the same or similar components, and wherein the figure (FIG. 1) is a diagrammatic perspective view of the improved superconductor furnace in accordance with the present invention.

DETAILED DESCRIPTION OF THE INVENTION

Figure 1:
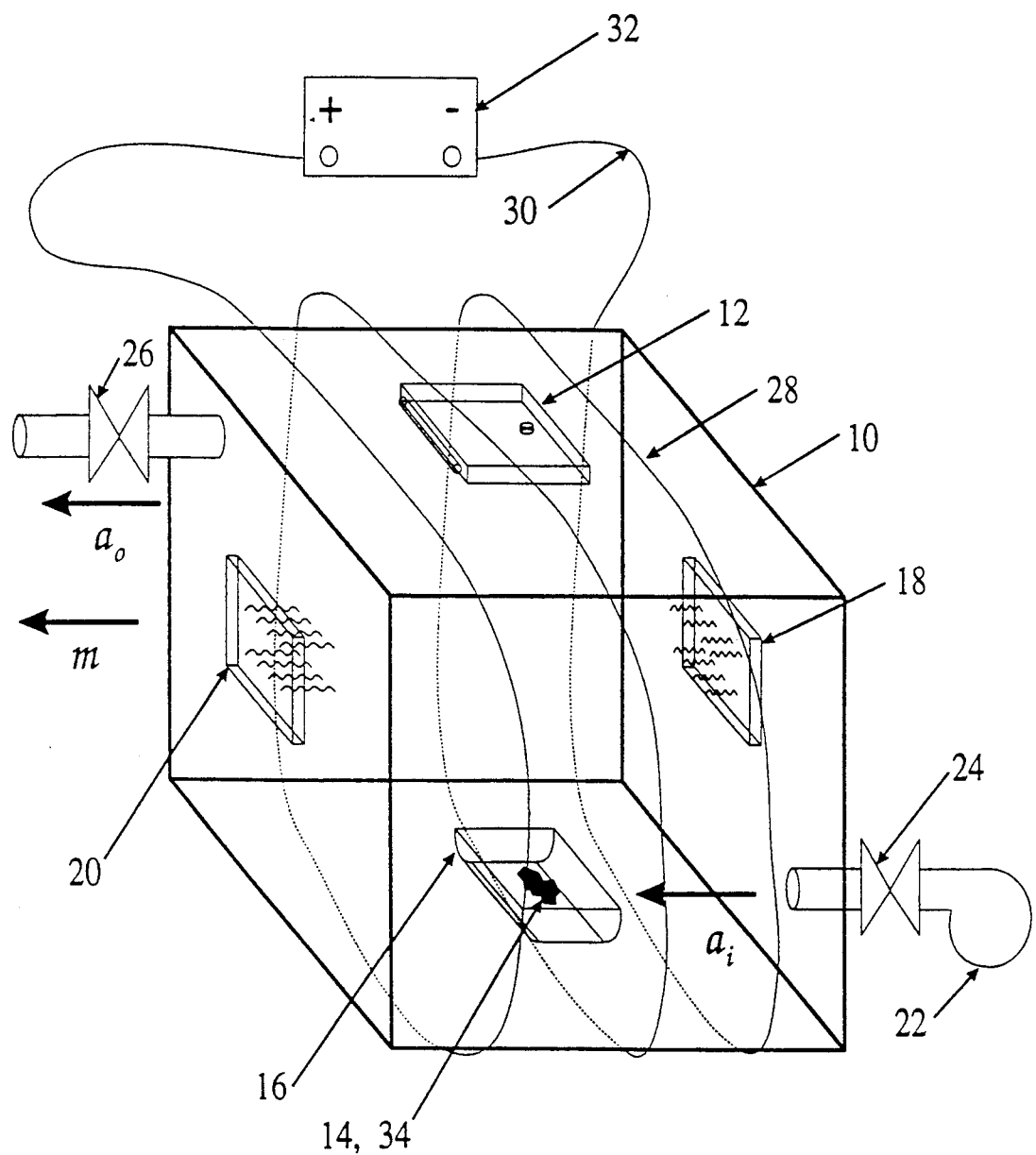

Referring now to FIG. 1, furnace 10 has air-tight door 12 for permitting placement of superconductor-solvent mixture 14 in crucible 16.

First heater 18 and second heater 20 are a pair of heater elements located noncentrally and at or toward opposite sides of furnace 10. Either first heater 18 or second heater 20, but not both first heater 18 and second heater 20, is actuated so as to apply uneven heat within furnace 10, thereby introducing a temperature gradient.

Air compressor 22 is actuated and pumps air into furnace 10 through inlet valve 24 in air inlet direction $a_i$ when inlet valve 24 has been opened. For many embodiments of this invention the pressure inside furnace 10 is raised to 10 to 20 atmospheres. Bleed-off outlet valve 26 is opened and air escapes in air outlet direction $a_o$, thereby introducing a pressure gradient which is substantially simultaneous with the temperature gradient.

Coil 28 is connected in circuit 30 to battery 32 and wound about furnace 10. Battery 32 is actuated and energizes now current-carrying coil 28, thereby introducing a magnetic field which is substantially simultaneous with the temperature gradient and the pressure gradient and which emanates in direction m and through superconductor precipitate material 34 as it forms in crucible 16.

Other embodiments of this invention will be apparent to those skilled in the art from a consideration of this specification or practice of the invention disclosed herein. Various omissions, modifications and changes to the principles described may be made by one skilled in the art without departing from the true scope and spirit of the invention which is indicated by the following claims.

What is claimed is:

1. Apparatus for producing textured superconducting material, comprising:
    a furnace;
    means for introducing a temperature gradient in said furnace; and
    means for introducing a pressure gradient in said furnace;
    said pressure gradient being substantially simultaneous with said temperature gradient;
    said means for introducing a temperature gradient including a heater;
    said means for introducing a pressure gradient including compressor means, inlet means, and outlet means;
    said compressor means being for pumping compressible fluid into said furnace;
    said inlet means being for introducing said compressible fluid into said furnace in a first direction, thereby raising the pressure in said furnace;
    said outlet means being for bleeding said compressible fluid out of said furnace, after said raising of said pressure in said furnace, in a second direction which is substantially parallel with said first direction;
    said inlet means including an inlet valve;
    said inlet valve and said outlet valve being located noncentrally and at substantially opposite sides of said furnace.

2. Apparatus for producing textured superconducting material as in claim 1, further comprising:
    means for introducing a magnetic field in said furnace whereby chirality is induced in said material;
    said magnetic field being substantially simultaneous with said temperature gradient and said pressure gradient;
    said means for introducing a magnetic field including electromagnetic energy supply means and electromagnetic energy conducting means.

3. Apparatus for producing textured superconducting material as in claim 1, wherein said compressor means includes a compressor.

4. Apparatus for producing textured superconducting material as in claim 2, wherein said compressor means includes a compressor.

5. Apparatus for producing textured superconducting material as in claim 2, wherein said electromagnetic energy supply means includes a battery and said electromagnetic energy conducting means includes coil.

6. A method for producing textured superconducting material, comprising:
    forming a superconductor-solvent mixture;
    placing said mixture in a furnace;
    introducing a temperature gradient in said furnace; and
    introducing a pressure gradient in said furnace;
    said pressure gradient being substantially simultaneous with said temperature gradient;
    said step of introducing a temperature gradient including actuating a heater;
    said step of introducing a pressure gradient including actuating compressor means, actuating inlet means, and actuating outlet means;
    said compressor means being for pumping compressible fluid into said furnace;
    said inlet means being for introducing said compressible fluid into said furnace in a first direction, thereby raising the pressure in said furnace;
    said outlet means being for bleeding said compressible fluid out of said furnace, after said raising of said pressure in said furnace, in a second direction which is substantially parallel with said first direction;
    said inlet means including an inlet valve;
    said outlet means including an outlet valve;
    said inlet valve and said outlet valve being located noncentrally and at substantially opposite sides of said furnace.

7. A method for producing textured superconducting material as in claim 6, further comprising:
    introducing a magnetic field in said furnace whereby chirality is induced in said material;
    said magnetic field being substantially simultaneous with said temperature gradient and said pressure gradient;
    said step of introducing a magnetic field including actuating electromagnetic energy supply means which energized electromagnetic energy conducting means.

8. A method for producing textured superconducting material as in claim 6, wherein said compressor means includes a compressor.

9. A method for producing textured superconducting material as in claim 7, wherein said compressor means includes a compressor.

10. A method for producing textured superconducting material as in claim 7, wherein said electromagnetic energy supply means includes a battery and said electromagnetic energy conducting means includes coil.

* * * * *